United States Patent [19]

Newman, et al.

[11] Patent Number: 5,305,244
[45] Date of Patent: Apr. 19, 1994

[54] HANDS-FREE, USER-SUPPORTED PORTABLE COMPUTER

[75] Inventors: Edward G. Newman, Fairfax; Gil S. Christian, Stephens City; Michael D. Jenkins, Manassas, all of Va.

[73] Assignee: Computer Products & Services, Inc., Fairfax, Va.

[21] Appl. No.: 863,619

[22] Filed: Apr. 6, 1992

[51] Int. Cl.$^5$ .............................. G06F 1/00; G06F 3/00
[52] U.S. Cl. .............................. 364/708.1; 364/709.11
[58] Field of Search ................. 364/708, 709.1, 709.2, 364/709.11, 483; 340/705

[56] References Cited

U.S. PATENT DOCUMENTS

| | | | |
|---|---|---|---|
| 4,672,667 | 6/1987 | Scott et al. | 381/41 |
| 4,722,065 | 1/1988 | Ogawa | 364/709 |
| 4,776,016 | 10/1988 | Hansen | 381/42 |
| 4,882,685 | 11/1989 | van der Lely | 360/709.11 |
| 4,916,441 | 4/1990 | Gombrich | 340/712 |
| 4,949,274 | 8/1990 | Hollander et al. | 364/483 |
| 4,969,193 | 11/1990 | Scott et al. | 381/38 |
| 5,003,300 | 3/1991 | Wells | 340/705 |
| 5,012,407 | 4/1991 | Finn | 364/200 |
| 5,025,471 | 6/1991 | Scott et al. | 381/43 |

OTHER PUBLICATIONS

T. J. Haven, "Reinventing The Color Wheel", *Information Display*, 7:1, p. 11-15 (Jan. 1991).
Reddy Information Systems, "Reddy To Wear", Issue 94, pp 1 and 18, *Optical Memory News* Apr. 1991.

*Primary Examiner*—Jerry Smith
*Assistant Examiner*—Chuong D. Ngo
*Attorney, Agent, or Firm*—Lorusso & Loud

[57] ABSTRACT

A compact, self-contained portable computing apparatus is provided which is completely supported by a user for hands-free retrieval and display of information for the user. The computing apparatus includes a voice-recognition module, in communication with a processor, for receiving audio commands from the user, for converting the received audio commands into electrical signals, for recognizing the converted electrical signals and for sending the recognized electrical signals to the processor for processing, the voice-recognition module being supported by the user. The computing apparatus further includes a display in communication with the processor for receiving information from the processor and for displaying the received information for the user, the display being supported by the user whereby the user may operate the computing apparatus to display information in a hands-free manner utilizing only audio commands.

13 Claims, 10 Drawing Sheets

HANDS-FREE, USER-SUPPORTED PORTABLE COMPUTER

BACKGROUND OF THE INVENTION

The present invention is generally related to computers, and more particularly to a hands-free, user-supported portable computer having a head-supported eye piece display and voice-recognition capability.

Today, many printed publications, particularly technical manuals, are being replaced by electronic technical manuals (ETM) and interactive electronic technical manuals (IETM). Such ETMs and IETMs are essentially electronic databases which are typically housed in conventional computers having a keyboard for user input and a full-sized monitor for information display. An operator may use the computer in order to access and display data stored in the ETMs and IETMs for a variety of uses including troubleshooting and repair/replacement of a system, subsystem or component thereof.

ETMs and IETMs are particularly useful in service and repair industries wherein technicians often require detailed information from technical manuals to repair and service malfunctioning devices. For example, ETMs and IETMs are useful in automobile repair centers wherein service personnel find it necessary to access information in automobile technical manuals in order to service malfunctioning automobiles. Additionally, ETMs and IETMs are useful in military service centers wherein military technicians often require access to information in military technical manuals to service and repair malfunctioning weapon systems. In such scenarios, it is more efficient to access information from ETMs and IETMs rather than printed publications since the printed publications may be voluminous.

As noted above, ETMs and IETMs are traditionally stored in and accessed from conventional computers having keyboards for operator input and full-sized video monitors for displaying data. Such computers are often located in service areas adjacent to the devices being repaired. In operation, maintenance personnel move back and forth between the computers and the devices being repaired in order to retrieve data required to service the devices being repaired. Such movement between the computers and the devices being repaired represents a considerable amount of time and effort spent for the purpose of retrieving data from the ETMs and IETMS. Therefore, conventional computers are not efficient devices for storing ETMs and IETMs since such conventional computers result in inefficient data delivery of the information in the ETMs and IETMs to operators.

SUMMARY OF THE INVENTION

The present invention is directed to a compact, self-contained portable computing apparatus which is completely supported by a user for hands-free retrieval and display of information for the user. The computing apparatus includes a housing having securing means for removably securing the housing to a user for support by the user. The housing further includes storage means for storing previously entered information, and processor means, communicating with the storage means, for receiving, retrieving and processing information and user commands in accordance with a stored program. The computing apparatus also includes audio transducer and converter means, in communication with the processor means, for receiving audio commands from the user, for converting the received audio commands into electrical signals, for recognizing the converted electrical signals, and for sending the recognized electrical signals to the processor means, the audio transducer and converter means also being supported by the user. The computing apparatus further includes display means in communication with the processor means for receiving information from the processor means and for displaying the received information for the user, the display means being supported by the user whereby the user may operate the computing apparatus to display information in a hands-free manner utilizing only audio commands.

BRIEF DESCRIPTION OF THE DRAWINGS

The foregoing summary, as well as the following detailed description of preferred embodiments, is better understood when read in conjunction with the appended diagrammatic drawings. For the purpose of illustrating the invention, there is shown in the drawings, embodiments which are presently preferred. It should be understood, however, that the invention is not limited to the specific instrumentalities and methods disclosed. In the drawings.

DETAILED DESCRIPTION OF THE PREFERRED EMBODIMENTS

Figure 1:
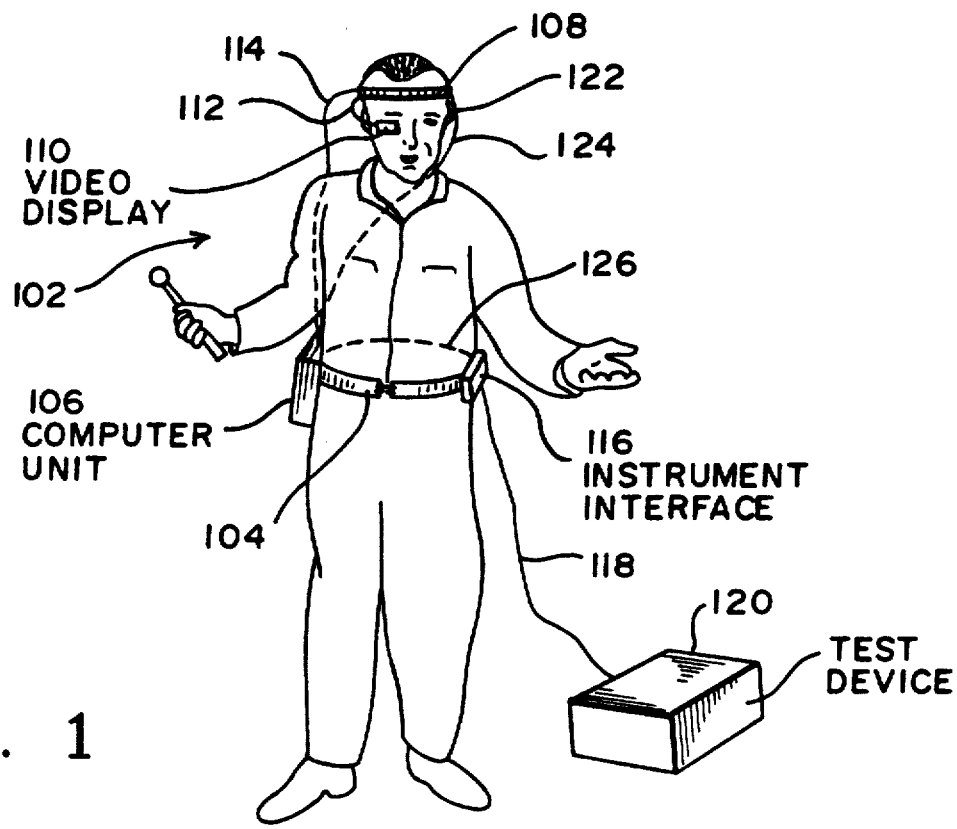
FIG. 1 is a front view of a schematic block diagram of an operator wearing a computer in accordance with the present invention.
Figure 2:
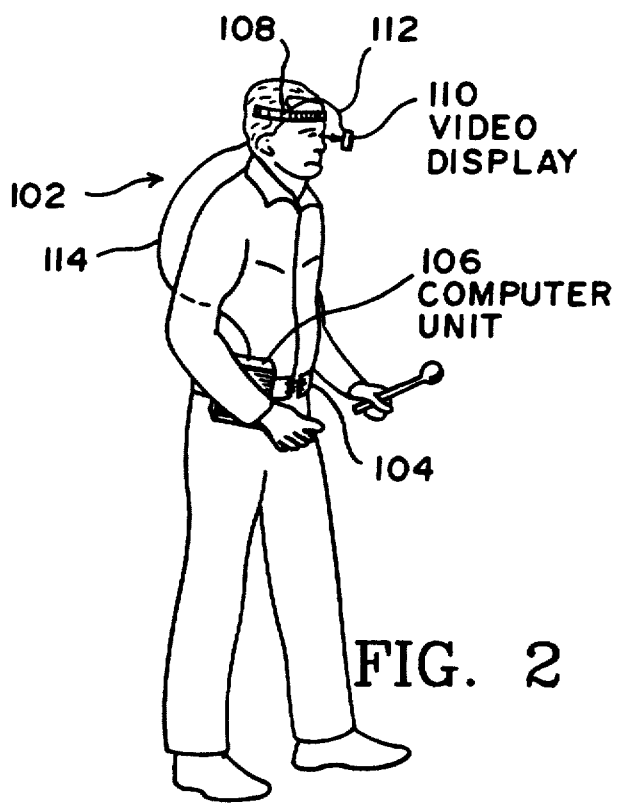
FIG. 2 is a side view of a schematic block diagram of an operator wearing the computer of FIG. 1.

Referring to the drawings in which like numerals are used for identical elements throughout, FIG. 1 is a front schematic view of an operator (also called a user) wearing a compact, portable computer 102 in accordance with the present invention and FIG. 2 is a side view of the operator wearing the computer 102. The location of the components of the computer 102 on the operator as shown in FIGS. 1 and 2 is representational only and may vary depending on operator convenience and comfort. The computer 102 includes a housing such as system unit 106 having a securing means, in the present embodiment a strap or belt 104, which is adapted to be worn around the operator's waist for securing the housing or system unit to the user for support by the user.

The computer 102 further includes display means for receiving information from the system unit 106 and for displaying the received information for the user or operator. The display means, in the present embodiment, includes a headband 108, a display screen 110, and an adjustable arm 112 connecting the display screen 110 to the headband 108. The headband 108 is adapted to be worn by the user in any convenient location, but preferably upon the user's forehead, as shown. The position of the display screen 110 may be adjusted via the adjustable arm 112 so that the operator can comfortably view information displayed on the display screen 110. The display screen 110 is electrically connected to the system unit 106, in the present embodiment, via a cable 114, although other connection means may alternatively be employed.

The computer 102 further includes audio transducer and converter means in communication with the system unit 106 for receiving audio commands from the user, for converting the receiver audio commands into electrical signals, for recognizing the converted electrical signals and for sending the recognized electrical signals to a processor within the system unit 106. In the present embodiment, the audio transducer and converter means includes a microphone 122 for receiving verbal commands from the operator. The microphone 122, which, in the present embodiment, is electrically connected to the system unit 106 via a cable 124 is preferably an ear-supported microphone, although those with ordinary skill in the art will appreciate that any audio-input or transducer device could be used and that the audio-input or transducer could be supported by the user at some other location such as proximate the mouth or throat of the user.

The computer 102, in the present embodiment, further includes measurement means in communication with the system unit 106 for performing electrical measurements on devices being evaluated by the computer 102 (such evaluation including, but not limited to, testing, calibrating, troubleshooting, diagnosing and servicing). In the present embodiment, the measurement means includes an instrument pack 116 which is attachable to the belt 104 and is electrically connectable via cables 118 to a device 120 which is to be tested, analyzed, repaired or the like. The instrument pack 116 is also electrically connected to system unit 106, in the present embodiment, via a cable 126.

From the foregoing description and FIGS. 1 and 2, it can be seen that the computer system 102 is adapted to be completely supported by a user or operator. The display screen 110 is placed to permit the user to accomplish other tasks, i.e., servicing a device, while glancing at the screen 110 for information concerning the task being performed. The microphone 122 permits the user to verbally control the computer system 102 to display desired information while maintaining the user in a hands-free mode for unimpaired performance of the task. Finally, the instrument pack 116 permits the computer 102 to obtain information from a device, such as a device being serviced, while maintaining the user in a hands-free mode with respect to the computer system 102 (note that the user may be handling the device being serviced, test equipment or other equipment while using the computer system 102). By utilizing the computer 102 the user is able to perform a task in a more efficient manner, since the user can access data from and input data to the computer system 102 in a hands-free mode with, at most, minimal diversion from the task being performed.

Figure 3:
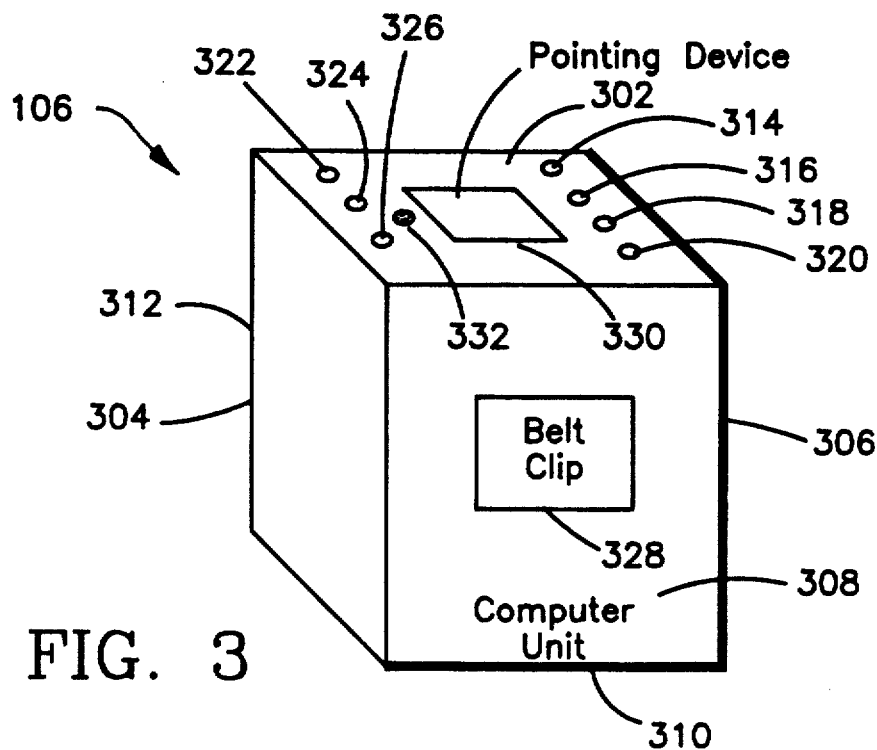
FIG. 3 is a perspective view of a system unit which forms part of the computer of FIG. 1.

FIG. 3 is an exterior perspective view of the system unit 106. Because the system unit 106 is intended to be supported by an operator, the system unit 106 is lightweight and small sized, in the present embodiment, preferably about five inches by six inches by three inches with a weight of approximately three pounds. The system unit 106 includes a top panel 302, a bottom panel 310, a front panel 312, a back panel 308, a first side panel 304, and a second side panel 306. Connected to the back panel 308 is a clip 328, for attaching the system unit 106 to the belt 104. Located on the top panel 302 is a microphone jack 314 which is of a type well known in the art. The cable 124 connected to the microphone 122 is removably connected to the system unit 106 via the microphone jack 314 using a suitable connector (not shown). Also located on the top panel 302 is a voice input indicator 318, preferably a light-emitting diode (LED), which illuminates to visually confirm when the ear microphone 122 receives verbal input from the operator.

Also located on the top panel 302 are a voice output indicator 316 and a volume control 320. In some embodiments, the top panel 302 also includes a speaker 332. The voice output indicator 316, preferably a single LED, illuminates to visually confirm when the computer 102 is outputting synthesized or digitized speech through the speaker 332 for the purpose of providing the user with information, queries, instructions, messages or other feedback. The volume control 320, preferably a rotatable knob or depressible button, controls the volume level of the audio output of the speaker 332. Also located on the top panel 302 are a reset system button 322, a Power On/Off button 324 and a Power-on indicator 326. The Power-On indicator 326, preferably a single LED, illuminates to visually confirm when the system unit 106 is turned on via the ON/OFF button 324. The system unit 106 initializes when the reset system button 322 is pressed. Also located on the top panel 302 is an input means in the form of a pointing device 330, such as a sensitive touch pad, a joy stick, roller ball or a gyroscopic mouse. The specific locations of the above-described elements on the top panel 302 as shown in FIG. 3 are representational only and may vary among particular implementations for ergonomic or other reasons. It should also be appreciated that the particular implementation of such elements (i.e., LEDs for indicators) may also vary.

In an alternate embodiment of the present invention, the microphone 122 (shown in FIG. 1) is a microphone/speaker assembly having a first transducer for receiving audio signals and a second transducer for outputting audio signals, the second transducer essentially being an audio speaker. The microphone/speaker assembly 122 may be, for example, a well-known bone-conduction device. According to the alternate embodiment, the speaker 332 shown in FIG. 1 is not necessary, and thus is not located on the front panel 332 and, in fact, is not part of the computer system 102.

Figure 4:
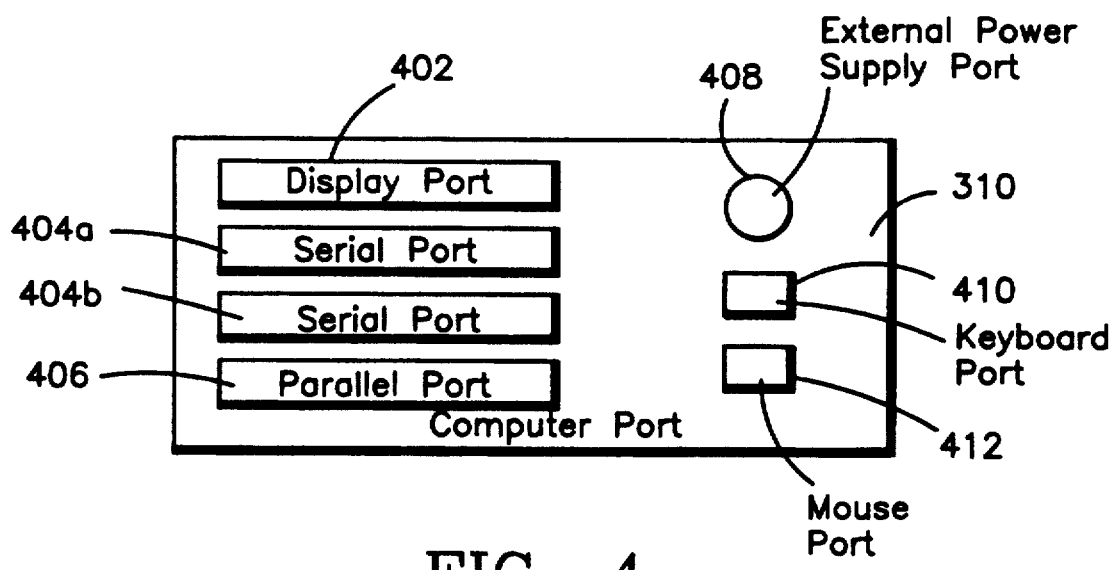
FIG. 4 is a bottom plan view of the system unit of FIG. 3.

FIG. 4 is an exterior plan view of the bottom panel 310 of the system unit 106. The bottom panel 310 includes a monitor or display port 402, two serial ports 404a and 404b, a parallel port 406, a keyboard port 410, a mouse port 412 and an external power supply port 408. According to the preferred embodiment, the serial ports 404a and 404b are RS-232 compatible and the parallel port 406 is centronics compatible. The system unit 106 may be modified to include additional and/or different ports and connectors without diverging from the spirit and intent of the present invention.

Figure 5:
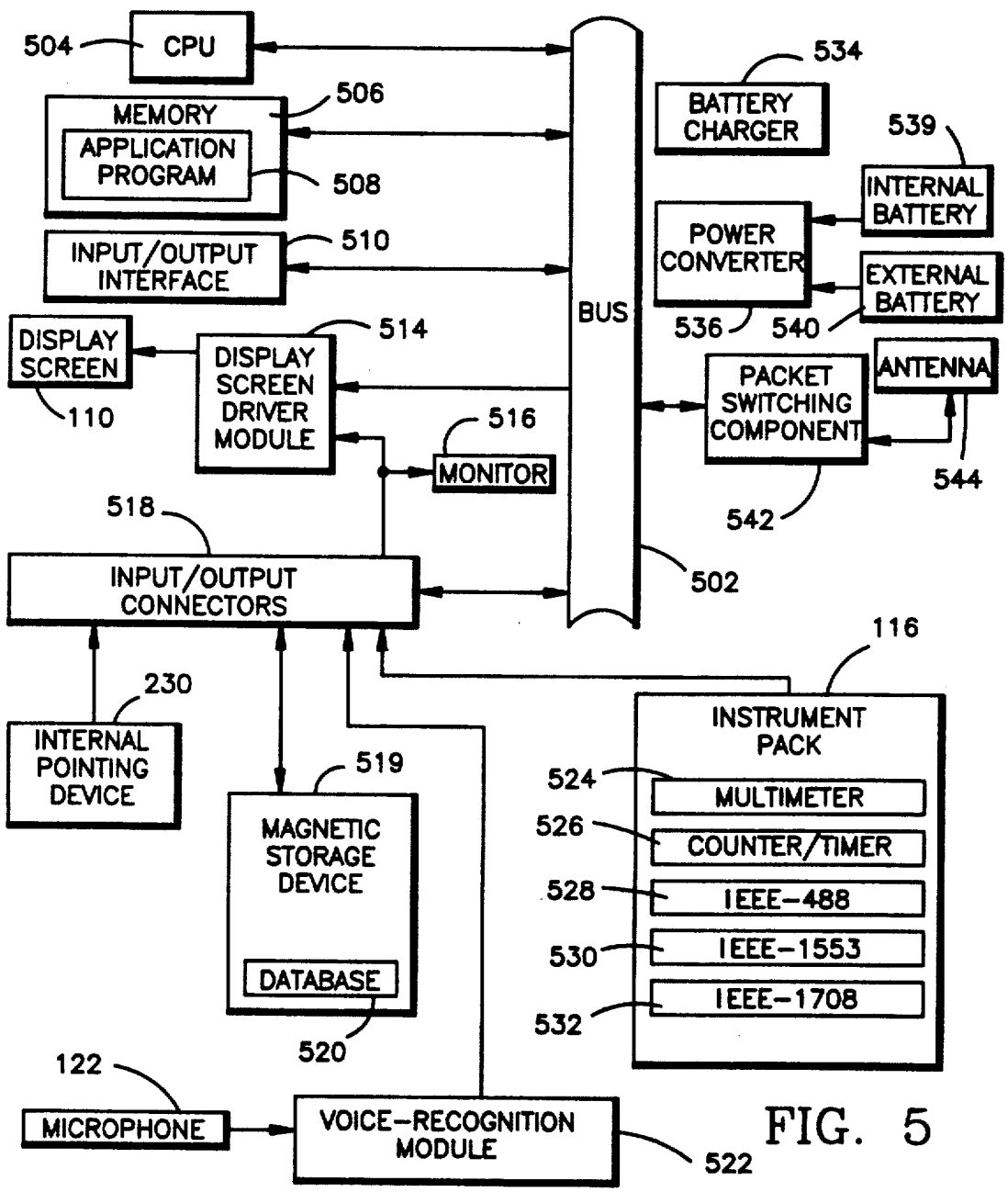
FIG. 5 is a schematic block diagram of the computer of FIG. 1.

FIG. 5 is a schematic block diagram of the primary structural features of the computer 102 in accordance with the present embodiment. The computer 102 includes a bus 502, which preferably has a data width of at least sixteen bits. According to the present embodiment, the bus 502 is contained in the system unit 106. The computer 102 also includes processor means such as central processing unit (CPU) 504, which is connected to the bus 502 and is also preferably contained in the system unit 106. Preferably, the CPU 504 is an 80286 or 80386SX microprocessor available from Intel. It will be appreciated by those of ordinary skill in the art that while an 80286 or 80386SX microprocessor is preferred, any other central processor or microprocessor, either available presently or in the future, could be used.

The computer 102 also includes a memory 506 having, for example, one Mbyte to twenty Mbytes of random access memory (RAM). The memory 506, which is also connected to the bus 502 and is preferably contained in the system unit 106, stores an application program 508 while the computer 102 is operating. The application program 508 may have been loaded into the memory 506 from a magnetic storage device 519 (described below) pursuant to operator instructions.

The computer 102 also includes an input/output interface 510 which controls all data transfers between the CPU 504 and certain other components (herein called peripherals) which communicate with the CPU 504 but which are not connected directly to the bus 502. Preferably, the input/output interface 510 includes a video interface, a controller for at least two RS-232 compatible serial ports, a controller for the centronics-compatible parallel port, keyboard and mouse controllers, a floppy disk controller, and a hard drive interface. However, it will be appreciated by those of ordinary skill in the art that the input/output interface 510 could include additional and/or different interfaces and controllers for use with other types of peripherals such as Ethernet ®, Arcnet ®, token ring interface. The input/output interface 510 is connected to the bus 502 and preferably is located in the system unit 106.

The computer 102 also includes input/output connectors 518 which collectively represent the above-described physical peripheral ports and accompanying electrical circuitry. Preferably, the input/output connectors 518 include the monitor port 402, serial ports 404a and 404b, parallel port 406, keyboard port 410, and mouse port 412 shown in FIG. 4. However, those of ordinary skill in the art will appreciate that the input/output connectors 518 could include additional and/or different types of physical ports.

The computer 102 also includes a power converter 536 which is connected to an internal battery 539, an external battery 540 and/or an AC power source such as a conventional electrical outlet (not shown in FIG. 5). The power converter 536 and the internal battery 539 are preferably located in the system unit 106 while the external battery 540 is located outside of the system unit 106, preferably attached to the belt 104. (The external battery 540 is not shown in FIGS. 1 and 2). The external battery 540 is connected to the power converter 536 via the external power supply port 408 shown in FIG. 4. When the computer 102 is used in a "desk-top" mode (e.g., non-portable mode), the power converter 536 may be connected to the AC power source for supplying regulated DC power to the computer 102. When the computer 102 is used in a portable mode, the power converter 536 is usually connected to the internal battery 539 and/or the external battery 540 for supplying regulated DC power to the computer 102. Preferably, the internal battery 539 supplies power to the power converter 536 (and ultimately the computer 102) only when the power converter 536 is not connected to either the external battery 540 or the AC power source. The computer 102 further includes a separate battery charger 534 for periodically charging the internal battery 539 and the external battery 540 when not in use. The computer 102 may include a battery-powered indicator, attached to the system unit 106 front panel 302, for indicating when the power levels of the external battery 540 and/or internal battery 539 are low.

Preferably, the bus 502, CPU 504, memory 506, input/output interface 510, input/output connectors 518, and power converter 536 described above are implemented using a backplane circuit card, processor circuit card, memory circuit card, input/output circuit card, and input/output connection circuit card in a manner well known to those skilled in the art. The processor circuit card, memory circuit card, input/output circuit card, and input/output connection circuit card are plugged into the backplane circuit card. Preferably, IBM PC/AT compatible and/or 80386 compatible circuit cards available from Dover Electronics Manufacturing of Longmont, CO and Ampro Computers of Sunnyvale, CA are used. The circuit cards from Dover Electronics Manufacturing occupy a cubic space of approximately two inches by five inches by two inches while each of the circuit cards from Ampro are approximately 3.8 inches by 3.6 inches. However, those having ordinary skill in the art will appreciate that any functionally compatible circuits cards which conform to the relatively small size of the system unit 106 could be used in place of the circuit cards available from Dover Electronics Manufacturing.

The computer 102 also includes display means which, in the present embodiment as noted above with reference to FIGS. 1 and 2, includes a headband 108, a display screen 110, and an adjustable arm 112 connecting the display screen 110 to the headband 108. As shown in FIG. 5, the display means further includes a display screen driver module 514 which preferably is located in the system unit 106, but which alternatively could be located outside of the system unit 106 adjacent to the display screen 110. The display screen driver module 514 converts display information (that is, information which is to be displayed for an operator) received from the CPU 504 (via the input/output interface 510, bus 502 and input/output connectors 518) into video signals which are sent to and compatible with the display screen 110. The display screen driver module 514 is of a standard design well known to those skilled in the art.

Preferably, the display screen 110 is a miniature monitor called an "eye piece monitor" which provides a display equivalent to conventional twelve-inch monitors (that is, approximately twenty-five lines by eighty characters per line), but which has a viewing screen with a diagonal length of approximately one inch. Since the display screen 110 is located close to the operator's eye and is supported by the operator's head so it follows the operator's head movement, the operator is able to view information on the display screen 110 without having to move away from his work bench (where, for example, a device is being repaired) by merely glancing from the device being repaired to the display screen 110. Therefore, the display screen 110, as described above, facilitates the retrieval of information contained in an electronic database since such information can be viewed without significantly diverting an operator's attention away from his work.

Those having ordinary skill in the art will appreciate that the display screen 110 and display screen driver module 514 can be implemented using any video technology either available presently or in the future, such as color graphics adaptor (CGA), and enhanced graphics adaptor (EGA), video graphics array (VGA), and super VGA. According to a present embodiment, however, the display screen 110 and display screen driver module 514 are implemented using well-known color graphic adapter (CGA) technology. CGA eye piece monitors are available from many vendors, including Reflection Technology, Inc., of Waltham, MA which produces and sells the Private Eye TM monitor. Alternatively, the display screen 110 and display screen driver module 514 are implemented using well-known (monochrome or color) video graphics adaptor (VGA) technology. VGA eye piece monitors which operate according to well-known color shutter wheel technology are currently available from sources, such as the Nucolor TM Shutters produced by Tektronix, Inc., of Beaverton, Oregon. The display means may alternatively be a flat panel display screen attached to the system unit 106.

Figure 11:
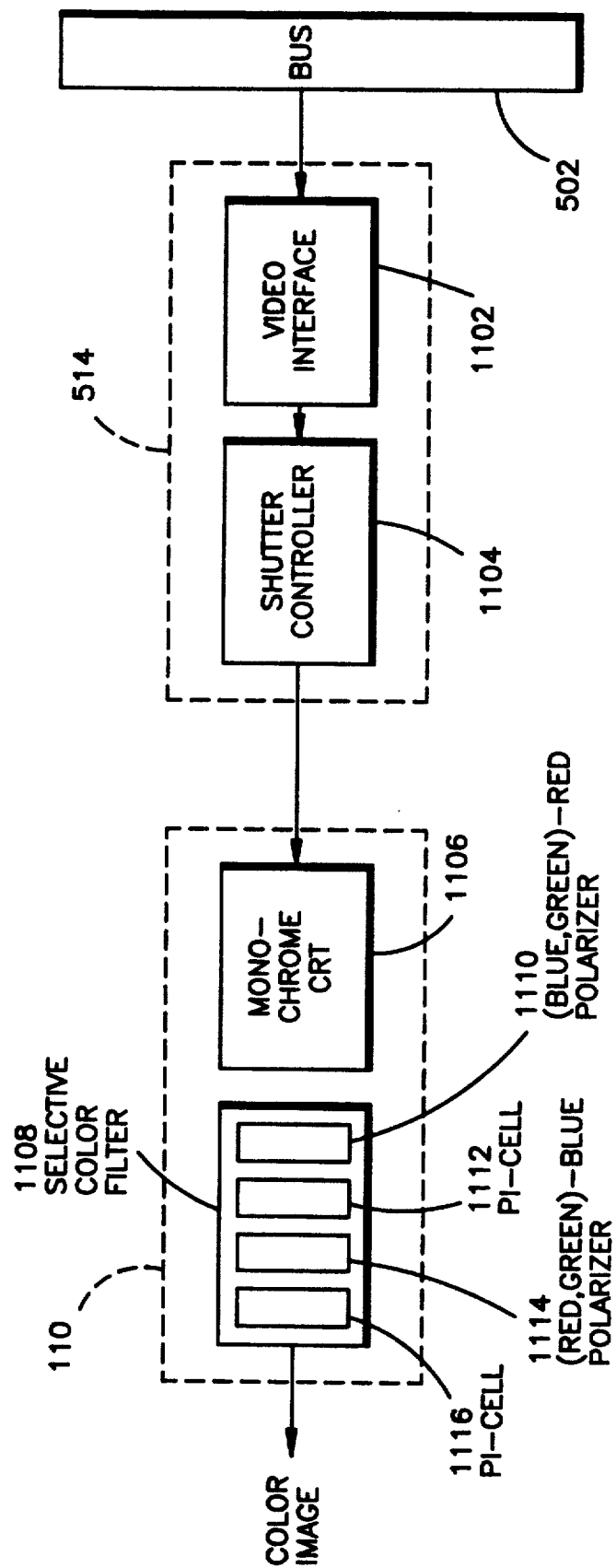
FIG. 11 is a block diagram of a display screen operating according to shutter-wheel technology.

FIG. 11 is a functional block diagram of a conventional display screen 110 connected to a conventional display screen driver module 514, both of which operate according to color shutter wheel technology. The display screen 110 has a monochrome cathode ray tube (CRT) 1106 and a filter 1108 having a color polarizer 1110 for polarizing and separating light from the CRT 1106 into cyan (that is, blue and green) and red components. The filter 1108 also includes a pi-cell 1112, which is preferably a relatively fast liquid-crystal switch, for rotating the polarized light from the color polarizer 1110 by either zero or ninety degrees. The filter 1108 also includes a second color polarizer 1114 for polarizing and separating light from the pi-cell 1112 into yellow (that is, red and green) and blue, which effectively divides the blue component from the green. The filter 1108 also includes a second pi-cell 1116, for rotating the polarized light from the color polarizer 1114 by either zero or ninety degrees.

The display screen driver module 514 includes a video interface 1102, which receives signals from the bus 502 representing data to be displayed on the display screen 110, and converts the signals into video signals generally having image and color information. The video signals are received by a shutter controller 1104, which causes the CRT 1106 to display an image in accordance with the image information, and which also controls the filter 1108 in accordance with the color information to convert the image displayed by the CRT 1106 to a color image.

The shutter controller 1104 causes the filter 1108 to transmit a red, green, or blue color image by selecting an appropriate combination of states of the pi-cells 1112 and 1116. In order to transmit green, for example, the shutter controller 1104 sets both pi-cells 1112 and 1116 to rotate by zero degrees, such that blue and green components from the first color polarizer 1110 passes through the first pi-cell 1112 unaffected. The vertically oriented yellow color polarizer 1114 then absorbs the blue components and leaves only the green component (note that only the vertical components are considered here since the light transmitted through the filter 1108 is always vertically polarized).

In order to transmit red, the shutter controller 1104 sets the first pi-cell 1112 to rotate by ninety degrees and the second pi-cell 1116 to rotate by zero degrees. Such alignment places the red component into the vertical position so that it passes through the yellow color polarizer 1114 unaffected. In order to transmit blue, the shutter controller 1104 sets both pi-cells 1112 and 1116 to rotate by ninety degrees, thereby rotating the initially vertically polarized blue component so it passes through the horizontally oriented blue color polarizer 1110. Color shutter wheel technology is further described in "Reinventing the Color Wheel" by Thomas J. Haven (*Information Display*, Vol. 7, No. 1, January 1991, pages 11–15), which is herein incorporated by reference in its entirety.

Referring again to FIG. 5, the computer 102 also includes various peripherals such as an internal pointing device 230, storing means such as magnetic storage device 519, measurement means such as instrument pack 116, a microphone 122 and a voice-recognition module 522, which are all connected to the system unit 106 (and, specifically, to the input/output interface 510 which controls data traffic between the peripherals and the CPU 504) via the input/output connectors 518. The internal pointing device 230 is a well-known pointing device such as a mouse, sensitive touch pad, or gyroscopic mouse which is connected to the top panel 302 of the system unit 106 (as shown in FIG. 3) and which represents an alternate means for an operator to interact with the computer 102 (that is, to provide commands and data to the CPU 504) in situations where the operator does not wish to or cannot interact via voice (that is, via the microphone 122 and voice-recognition module 522) as described below. For example, the operator may not be able to interact via voice in work environments where the background noise is too excessive for even external hearing protection work. The present invention also supports other non-audio input devices such as bar code readers, touch memory readers and proximity scanners, which may be used when the operator does not wish to or cannot interact with the computer 102 via voice.

The computer 102 also includes a packet switching component 542 and an antenna 544 which, in the present embodiment, are preferably contained in the system unit 106 and which enable the computer 102 to send and receive information from remote locations via well-known telecommunication means, such as via telephone or satellite. The packet-switching component 542 and the antenna 544 are particularly useful for updating a database 520 stored in a magnetic storage device 519 (described below) in real-time with information received from a remote computer or other data source. The computer 102 may include a global positioning system component (not shown in FIG. 5) for receiving and processing (via the antenna 544) positioning information from navigation systems, such as the Global Positioning System.

The magnetic storage device 519, which is preferably contained in the system unit 106, is a static, read/write memory having a relatively large memory capacity such as a removable or non-removable hard disk drive. In embodiments where the storage device 519 is removable, the system unit 106 contains an external slot for allowing the operator to insert and remove removable storage disks. An optional storage device 519 could be a read-only memory such as a CD-ROM. Preferably, the magnetic storage device 519 includes 80 Mbytes to one gigabyte of memory. Magnetic storage devices which are suitable for use as the magnetic storage device 519 and which have a size compatible with the size of the system unit 106 are produced and sold by various manufacturers such as Integral, Connor, Seagate and Syquest. As shown in FIG. 5, the magnetic storage device 519 stores a database 520 (which may be an ETM or IETM) which may have been previously loaded into the magnetic storage device 519 from a floppy drive (not shown in FIG. 5) which could be connected to the computer 102 via a port on the input-/output connectors 518, or from a remote computer via a telecommunication link connected to the computer via the packet switching component 542 and the antenna 544 or by direct cabling.

The instrument pack 116 includes electrical measurement equipment such as a multimeter 524 and a counter/timer 526, and ports for connecting the electrical measurement equipment to devices being evaluated or serviced such as an IEEE-488 connector 528, an IEEE-1553 connector 530 and an IEEE-1708 connector 532. Those with ordinary skill in the art will realize that the instrument pack 116 could contain other types of electrical measurement equipment and ports. Referring again to FIG. 1, in operation the electrical measurement equipment in the instrument pack 116 is connected to a device being evaluated or serviced, hereinafter called a device under test (DUT) 120, via a cable 118 which is connected to any one of the connectors 528, 530, and 532 (depending on the particular type of interface on the DUT 120). Data from the DUT 120 is measured by the multimeter 524, counter/timer 526 and/or any other measurement equipment contained in the instrument pack 116 (as appropriate for the test being performed). The results of such tests are sent from the instrument pack 116 to the CPU 504 via the input/output connectors 518 and the bus 502. Alternatively, they can be stored on battery-backed memory chips.

Referring again to FIG. 5, the computer 102 may also include an external monitor 516 which is not supported by an operator (but rather rests on a desk, for example) and which connects to the system unit 106 via the monitor port 402 (shown in FIG. 4). The external monitor 516 receives from the CPU 504 the same display information as the display screen 110 (via the display screen driver module 514). The computer 102 may also include an external keyboard and mouse (not shown), which are connectable to the system unit 106 via the keyboard port 410 and mouse port 412, respectively. The external keyboard and mouse represent conventional means for an operator to interact with the computer 106. Preferably, the external monitor 516, external keyboard and external mouse are connected to the system unit 106 when the computer 102 is operating in a non-portable mode (e.g., as a desk-top computer).

The voice-recognition module 522 is preferably contained in the system unit 106 and is connected to the microphone 122 (which is preferably an ear microphone located outside of the system unit 106). Alternatively, the voice-recognition module 522 may be located outside of the system unit 106 and, for example, may be incorporated with the microphone 122 as a single unit. Alternatively, the analog-to-digital converter component of the voice-recognition module 522 is located outside of the system unit 102 while the remaining components of the voice-recognition module 522 is located inside the system unit 102, the external analog-to-digital converter preferably communicating with the system unit 02 via a serial communication stream. The microphone 22 receives audio input (also called verbal utterances) from an operator, converts the audio input to electrical signals and digitizes the electrical signals. The voice-recognition module 522 recognizes the verbal utterances (which are in the form of digitized electrical signals) and transfers the recognized verbal utterances to the CPU 504 for processing according to the application program 508. Thus, just as a conventional keyboard driver interprets as characters and words the electrical signals which result from an operator typing on a conventional keyboard, the voice-recognition module 522 interprets (or recognizes) as characters and words the digitized electrical signals which result from an operator speaking near or into the microphone 122. Consequently, like conventional input devices such as keyboards and pointing devices, the voice-recognition module 522 in combination with the microphone 122 provides a means for operators to interact with and control the operation of the computer 102.

Preferably, the voice-recognition module 522 operates according to well-known dependent voice recognition algorithms and is implemented in hardware of a type well known in the art. According to a preferred embodiment, the voice-recognition module 522 is a dependent voice recognition circuit card available from Voice Connection of Irving, California. However, those with ordinary skill in the art will appreciate that any dependent voice recognition circuit card having a size compatible with the size of the system unit 106 could be used.

Alternatively, the voice-recognition module 522 operates according to well-known independent voice recognition algorithms, the independent voice recognition algorithms representing an improvement over dependent voice recognition algorithms. Specifically, an independent voice-recognition module is able to recognize the voices of multiple speakers and includes "good listener", a learning feature for real time modification of a trained vocabulary model. In contrast, a dependent voice-recognition module can recognize only a single speaker's voice.

Further, an independent voice-recognition module can be integrated with application programs. For example, an application program could interact with an independent voice-recognition module in order to cause the independent voice-recognition module to recognize a verbal utterance against a subset of an entire trained vocabulary model. The vocabulary subset could include, for example, the words corresponding to menu selections in the current context of the application program. In contrast, dependent voice-recognition modules cannot be integrated with application programs. Therefore, dependent voice-recognition modules are generally less reliable than independent voice-recognition modules since dependent voice-recognition modules usually attempt to recognize verbal utterances from the entire vocabulary. Systems and methods for voice recognition, and particularly for independent voice recognition, are described in U.S. Pat. Nos. 5,025,471, 4,969,193 and 4,672,667, both of which are herein incorporated by reference in their entireties.

Figure 6:
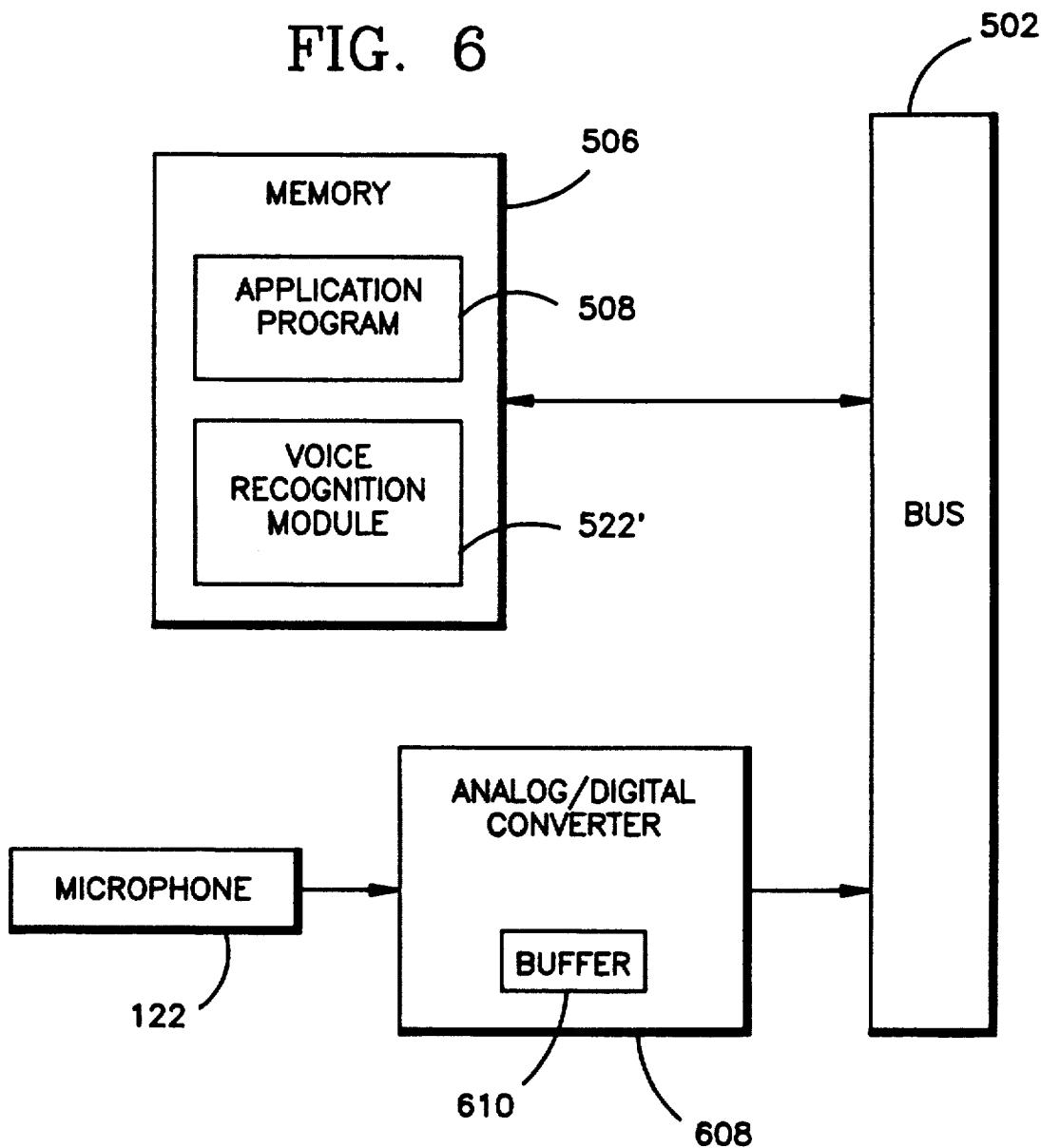
FIG. 6 is a partial schematic block diagram of an alternate embodiment of the computer of FIG. 1.

FIG. 6 is a partial block diagram of the computer 102 wherein the voice-recognition module 522 is implemented in software, rather than in hardware, as shown in FIG. 5. More particularly, FIG. 6 is a partial block diagram illustrating the structural differences (as compared to FIG. 5) in the computer 102 which are required to implement the alternate embodiment wherein the voice-recognition module 522 is implemented in software. As shown in FIG. 6, the software implementation of the voice-recognition module is indicated as 522', rather than 522, in order to underscore its software nature, and is stored in the memory 506 while the computer 102 is operating. The voice-recognition module 5221 operates either according to dependent or independent voice recognition algorithms, although preferably the voice-recognition module 522' operates according to independent voice recognition algorithms and is implemented as independent voice recognition software produced by Scott Instruments of Denton, Tex. In practice, the application program 508 and the voice-recognition module 522' may be linked into a single computer program which is loaded into the memory 506 from the magnetic storage means 519 pursuant to operator instructions.

According to the alternate embodiment wherein the voice-recognition module 522' is implemented in software, the computer 102 includes an analog/digital converter 608 which has buffer 610 and which is preferably contained in the system unit 106. The analog/digital converter 608 is connected to the microphone 122. In operation, the microphone 122 converts audio input spoken by an operator to electrical signals. The analog/digital converter 608 digitizes the electrical signals and stores the digitized electrical signals in the buffer 610 for later retrieval by the CPU 504.

Figure 7:
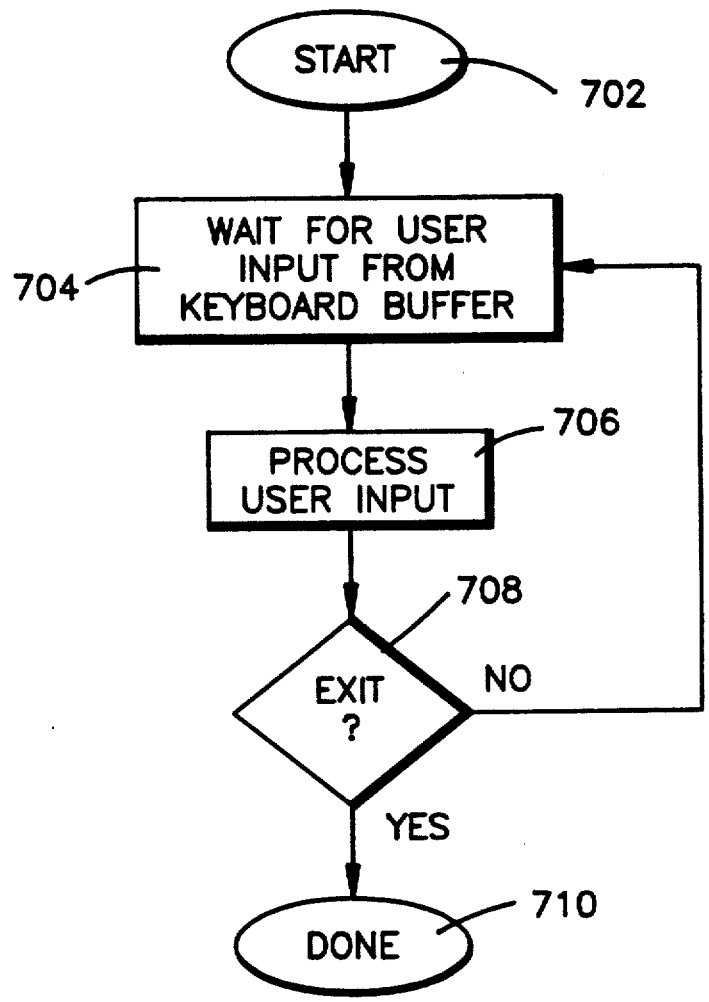
FIG. 7 is an operational flow chart of the computer of FIG. 1 wherein the computer includes a dependent voice-recognition module.
Figure 8:
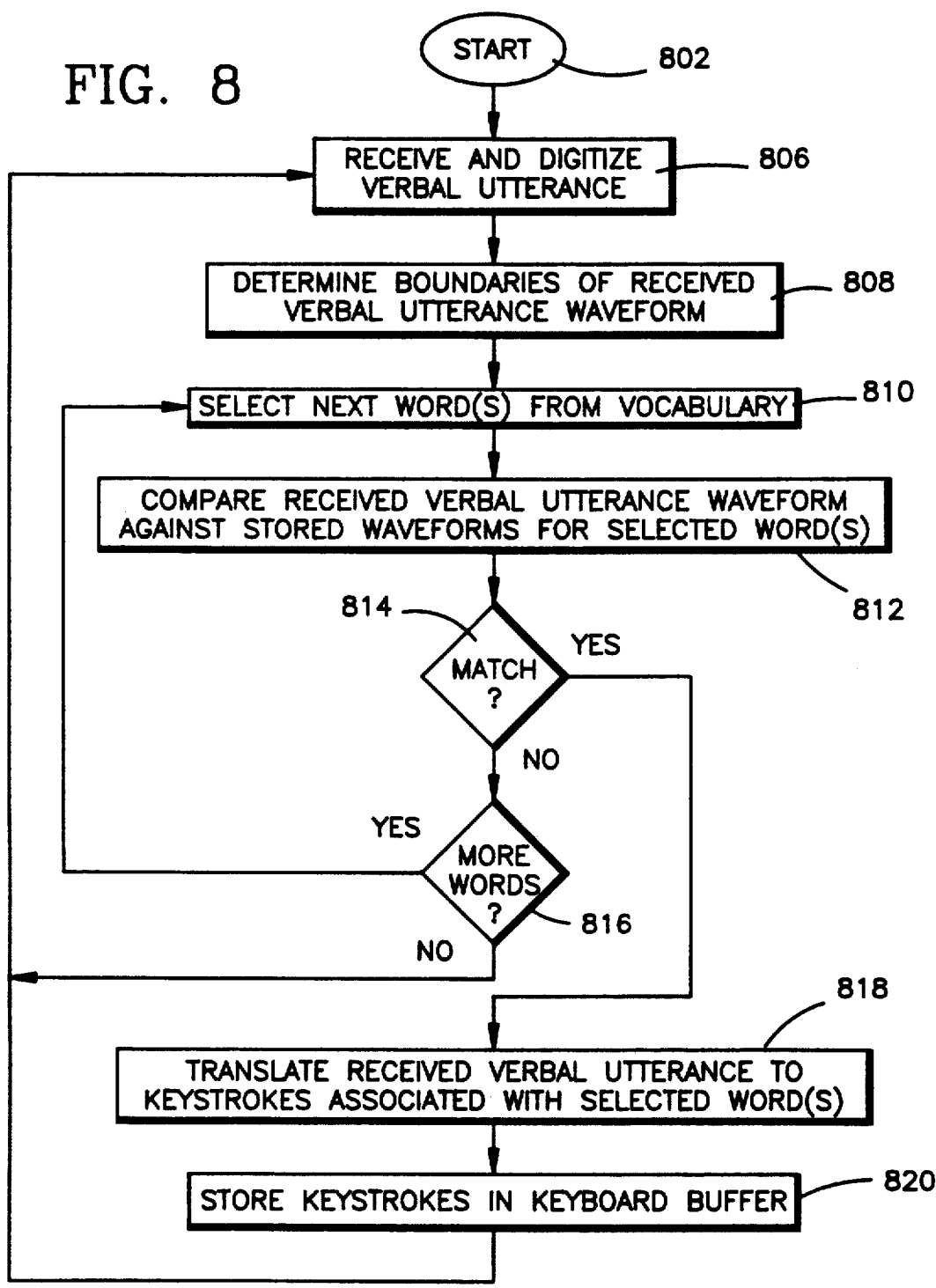
FIG. 8 is an additional operational flow chart of a dependent voice-recognition module.
Figure 9:
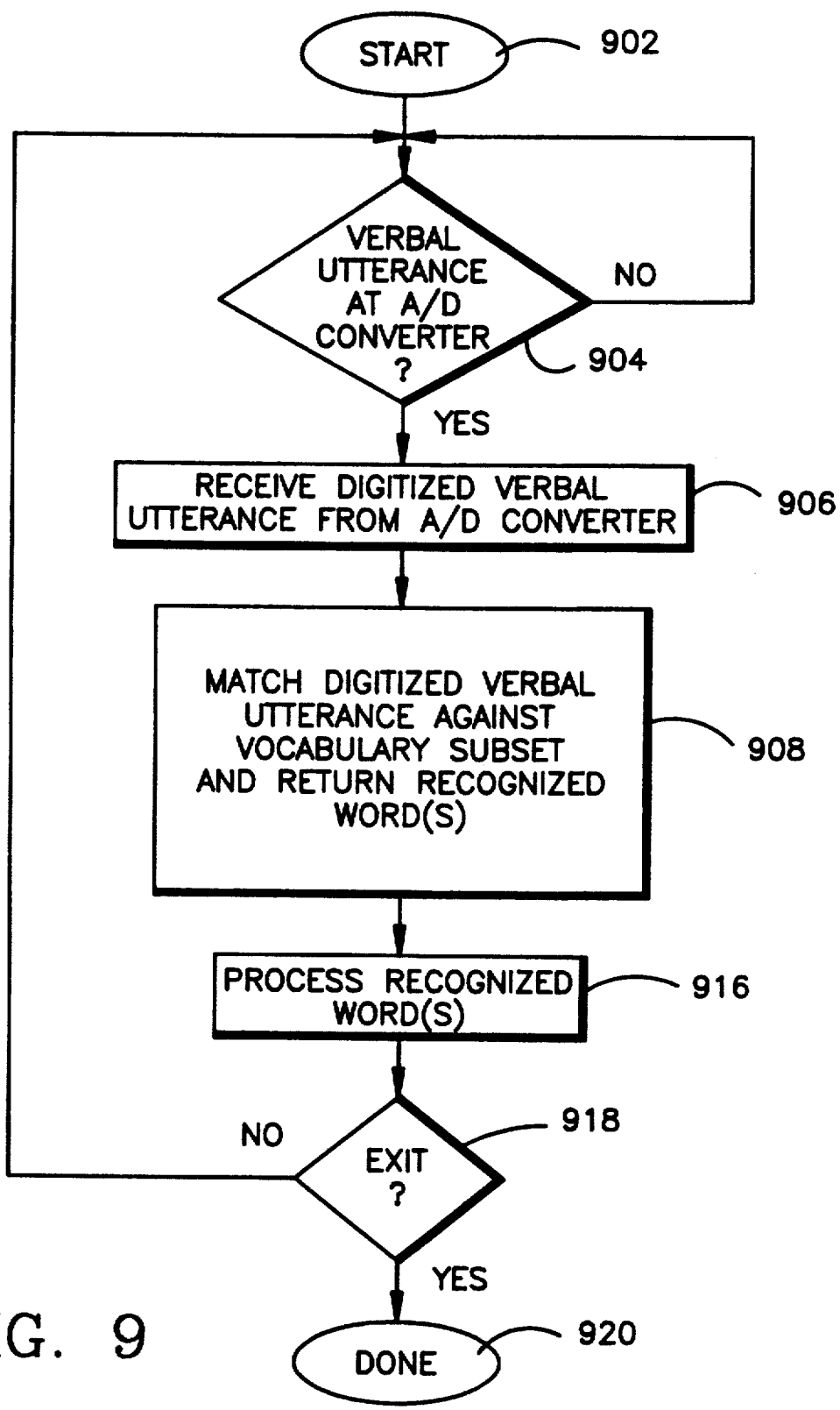
FIG. 9 is an operational flow chart of the computer of FIG. 1 wherein the computer includes an independent voice-recognition module.
Figure 10:
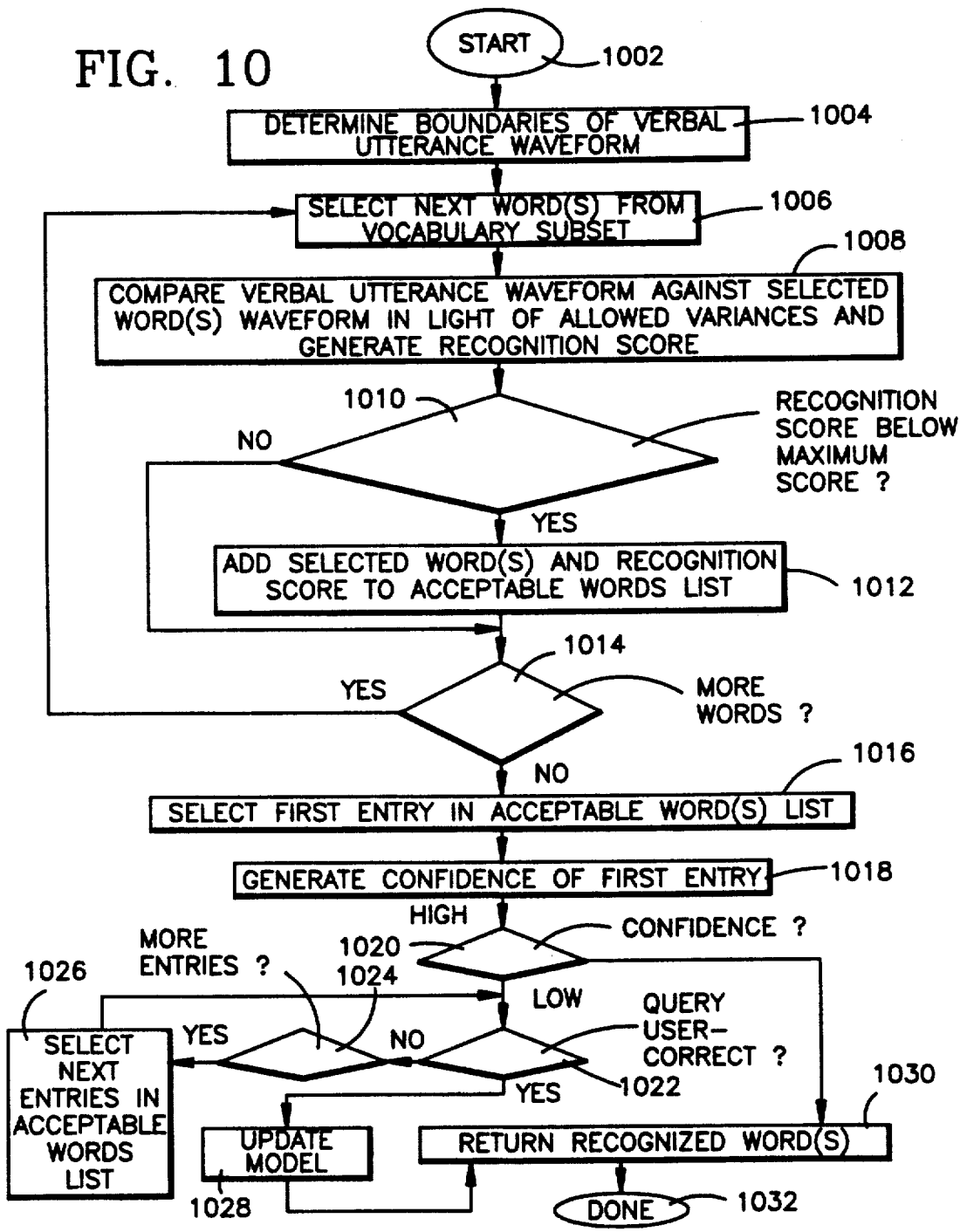
FIG. 10 is an additional operational flow chart of an independent voice-recognition module.

The operation of the computer system 102 shall now be described with reference to FIGS. 7, 8, 9 and 10 wherein FIGS. 7 and 8 represent the operation of the computer 102 wherein a dependent voice-recognition module (implemented in either hardware or software) is used and FIGS. 9 and 10 represent the operation of the computer 102 wherein an independent voice-recognition module (implemented in either hardware or software) is used.

Referring first to FIG. 7, there is shown an operational flow chart for the computer system 102 according to the embodiment wherein a dependent voice-recognition module is used. While performing the steps shown in FIG. 7, the computer system 102 is operating according to the programming contained in the application program 508. For simplicity purposes, FIG. 7 is described below with reference to the structural embodiment of the computer 102 shown in FIG. 5, although it should be understood that the alternate structural embodiment of the computer 102 shown in FIG. 6 operates in substantially the same manner with regard to the flow chart in FIG. 7.

In step 704, the CPU 504 waits for user input from a keyboard buffer (not shown). In practice, the CPU 504 may perform step 704 by either polling the keyboard buffer or by receiving an interrupt when the keyboard buffer is full. In either case, the CPU 504 receives user input from the keyboard buffer when the keyboard buffer is flushed by a keyboard driver or other operating system tool which is associated with the keyboard buffer. Note that the user input in the keyboard buffer may originate from a conventional input device such as a keyboard or pointing device, or from the voice-recognition module 522.

In step 706, the CPU 504 processes the user input according to the programming contained in the application program 508. For example, the user input could represent a command from the user to retrieve particular data from the database 520 stored in the magnetic storage device 519. The CPU 504 processes the user command by accessing and retrieving the requested data from the database 520 and transferring the retrieved data to the display screen 110 for display to the user. Specifically, the CPU 504 transfers the retrieved data to the input/output interface 510 along with a request to display the data on the display screen 110. The input/output interface 510 converts the retrieved data to generic video signals generally appropriate for display on monitors and sends the generic video signals to the display screen driver module 514 via the input/output connectors 518. The display screen driver module 514 translates the generic video signals to video signals compatible with the particular display screen 110. Alternatively, the user input could be information which the user is providing to the computer 102 (for storage in the storage device 520, for example).

In step 708, the CPU 504 determines if the user command represented an exit request. If the user command did not represent an exit request, then the CPU 504 loops back to step 704 to await further user input.

Figure 12:
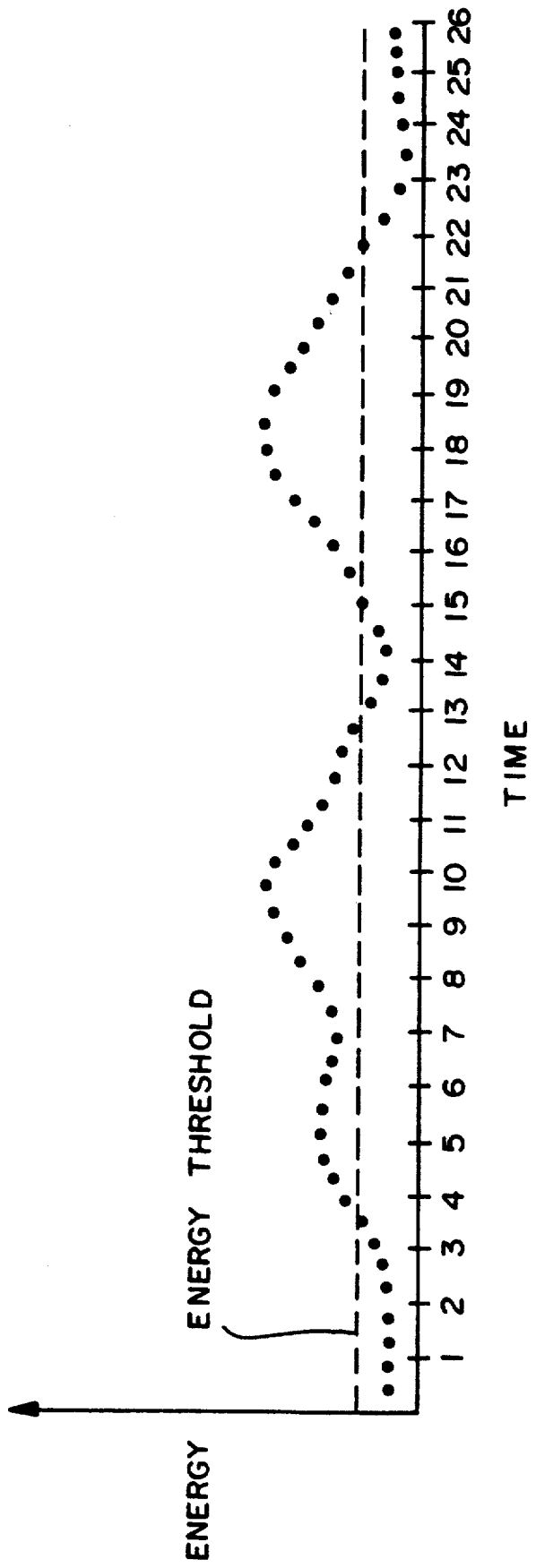
FIG. 12 is a digitized waveform of a verbal utterance.

FIG. 8 is an operational flow chart of the voice-recognition module 522 (shown in FIG. 5) or the voice-recognition module 522' in combination with the analog/digital converter 608 (shown in FIG. 6) wherein the voice-recognition module 522 or 522' operates according to dependent voice recognition algorithms. Note that before the steps in FIG. 8 are performed, the voice-recognition module 522 or 522' is trained using well-known methods for a particular operator to produce a vocabulary model containing words and phrases which the voice-recognition module 522 or 522' recognizes. Since it is well known, the vocabulary model is not discussed here except to note that, for each word or phrase which the voice-recognition module 522 or 522' recognizes, the vocabulary model contains a finite number (such as five) of digitized waveforms corresponding to different ways in which the particular operator (for whom the voice-recognition module 522 or 522' is trained) pronounces the word or phrase. FIG. 12 is an example of one such waveform of a two-word phrase (such as "Next Menu" or "End Program") wherein the first word is represented by points between times four and thirteen and the second word is represented by points between times sixteen and twenty-two. The words are delimited by points between times zero and three, fourteen and fifteen and twenty-three and twenty-six which fall below an energy threshold, which is determined for the particular operator. The vocabulary model also contains one or more operator-selected keystrokes associated with each word and phrase which the voice-recognition module 522 of 522' recognizes. For example, the phrase "End Program" may be associated with the keystrokes "Ctrl", ""X" if the keystrokes "Ctrl", "X" are recognized by the application program 508 as the "End Program" command.

FIG. 8 shall now be described. For simplicity purposes, FIG. 8 is described below with reference to the structural embodiment of the computer 102 shown in FIG. 5, although it should be understood that the alternate structural embodiment of the computer 102 shown in FIG. 6 operates in substantially the same manner with regard to the flow chart in FIG. 8.

Referring now to FIG. 8, in step 806 the voice-recognition module 522 receives from the microphone 122 electrical signals representing a verbal utterance spoken by an operator, digitizes the received electrical signals and sends the digitized electrical signals to the voice-recognition module 522.

In step 808, the voice-recognition module 522 identifies the boundaries of a word or phrase contained in the digitized electrical signals by locating points in the digitized electrical signals which fall below the energy threshold (as shown in FIG. 12, for example) for the particular operator, the located points representing the boundaries of words. The voice-recognition module 522 determines that the digitized electrical signals contain a phrase (that is, multiple words), rather than a single word, if words in the digitized electrical signals are separated by less than a predefined number (which is set according to the speaking characteristics of the particular operator) of points which fall below the energy threshold. The points in the digitized electrical signals corresponding to a word or phrase represent a digitized verbal utterance waveform which was received from the operator (that is, which was spoken by the operator). For example, if FIG. 12 represents the digitized electrical signals and if the predefined number is five, then the voice-recognition module 522 determines (in step 808) that the digitized electrical signals contain a phrase having two words because the two words are separated by only four points (between times thirteen and fifteen) which fall below the energy threshold. The points in the digitized electrical signals corresponding to the two-word phrase represent the received digitized verbal utterance waveform.

In steps 810, 812, 814 and 816, the voice-recognition module 522 recognizes the received digitized digitized verbal utterance waveform by matching the received digitized verbal utterance waveform against all the digitized waveforms (corresponding to different ways in which the particular operator pronounces different words) contained in the vocabulary model. Specifically, in step 810 the voice-recognition module 522 selects the next word from the vocabulary model to process. Recall that the vocabulary model contains a finite number of digitized waveforms for the selected word corresponding to different ways in which the particular operator pronounces the selected word, and that the vocabulary model contains one or more operator-selected keystrokes associated with the selected word.

In step 812, the voice-recognition module 522 performs a point-by-point comparison of the received digitized verbal utterance waveform and the digitized waveforms for the selected word and determines whether there is a match between the received digitized verbal utterance waveform and any of the digitized waveforms for the selected word. The voice-recognition module 522 determines that a match occurs between a point in the received digitized verbal utterance waveform and a corresponding-in-time point contained in one of the digitized waveforms if the difference between the two points is less than an operator predefined limit, which may be zero for some implementations.

In step 814, the voice-recognition module 522 determines whether a match was found in step 812 and proceeds to step 816 if a match was not found. In step 816, the voice-recognition module 522 determines whether there are any more words in the vocabulary module left to process. If, in step 816, the voice-recognition module 522 determines that there are more words left to process, then the voice-recognition module 522 flows back to step 810 to select the next word from the vocabulary model to process. Otherwise, the voice-recognition module 522 determines that the received digitized verbal utterance waveform cannot be recognized based on the current training of the vocabulary model and returns to step 806 to await further operator input. Note that, when operating according to dependent voice-recognition algorithms, the voice-recognition module 522 does not interact with the operator to update the training of the vocabulary model to recognize the received digitized verbal utterance waveform.

If, in step 814, the voice-recognition module 522 determines that a match was found in step 812, then the voice-recognition module 522 performs step 818. In step 818, the voice-recognition module 522 translates the received digitized verbal utterance waveform to the keystrokes contained in the vocabulary model and associated with the selected word (which the received digitized verbal utterance waveform matched). In step 820, the voice-recognition module 522 stores the keystrokes in the keyboard buffer. As described above, the keystrokes in the keyboard buffer are processed by the CPU 504 when the keyboard buffer is flushed (see the above text describing step 704 in FIG. 7).

FIG. 9 is an operational flow chart for the computer system 102 according to the embodiment of the present invention wherein an independent voice-recognition module is used. While performing the steps shown in FIG. 9, the computer system 102 is operating according to the programming contained in the application program 508.

For simplicity purposes, FIG. 9 is described below with reference to the structural embodiment of the computer 102 shown in FIG. 6, although it should be understood that the alternate structural embodiment of the computer 102 shown in FIG. 5 operates in substantially the same manner with regard to the flow chart in FIG. 9.

Note that before the steps in FIG. 9 are performed, the voice-recognition module 522' is trained for multiple operators using well-known methods to produce a vocabulary model containing words and phrases which the voice-recognition module 522' recognizes. Since it is well known, the vocabulary model is not discussed here except to note that, for each word or phrase which the voice-recognition module 522' recognizes, the vocabulary model contains a single digitized waveform corresponding to a base line pronunciation of the word or phrase. FIG. 12, which was described above, is an example of one such digitized waveform containing a two-word phrase. The vocabulary model also contains operator-selected strings (each having one or more characters) associated with each word or phrase which the voice-recognition module 522' recognizes. For example, the phrase "End Program" may be associated with the string "<Ctrl>X" if the string "<Ctrl>X" is recognized by the application program 508 as the "End Program" command.

The vocabulary model also contains permitted variances about each of the points in the digitized base line waveforms, the permitted variances representing different ways of pronouncing the words and phrases by the operators for whom the voice-recognition module 522' is trained. For example, suppose that the digitized waveform in FIG. 12 represents a digitized base line waveform contained in the vocabulary model, that the permitted variance for the point at time ten is two, and that the point at time ten has a digital amplitude of fifteen. According to this example, any digitized verbal utterance waveform having an amplitude at time ten in the range from thirteen to seventeen will match the digitized base line waveform in FIG. 12, at least with regard to the point at time ten.

Referring now to FIG. 9, in step 904, the CPU 504 determines whether a verbal utterance, spoken by an operator into the microphone 122, exists at the analog/digital converter 608. In practice, the microphone 122 converts audio signals from the operator (that is, verbal utterances from the operator) into electrical signals and sends the electrical signals to the analog/digital converter 608. The analog/digital converter 608 digitizes the received electrical signals and places the digitized electrical signals into the buffer 610. The CPU 504 then performs step 904 by polling the analog/digital converter 608 to determine when the buffer 610 is full. When the buffer 610 is full, the CPU 504 instructs the analog/digital converter 608 to send the digitized electrical signals, which represents a digitized verbal utterance, from the buffer 610 to the CPU 504 via the bus 502.

In step 906, the CPU 504 receives the digitized verbal utterance from the analog/digital converter 608 via the bus 502.

In step 908, the CPU 504 causes the voice-recognition module 522' to recognize the digitized verbal utterance against a subset of the words and phrases contained in the vocabulary model. That is, the CPU 504 passes a number of words and phrases to the voice-recognition module 5221 and instructs the voice-recognition module 522' to determine whether the digitized verbal utterance matches any of the stored digitized base line waveforms associated with the passed words and phrases, taking into consideration the permitted variances for each of the digitized base line waveforms. As a result of step 908, the voice-recognition module 522' passes the string stored in the vocabulary model and associated with the matched word or phrase to the CPU 504 for processing.

In practice, the words which are passed by the CPU 504 to the voice-recognition module 522' may represent menu choices from a current context of the application program 508. For example, the application program 508 might have asked the operator to select from a menu of choices. In processing step 908, the voice-recognition module 522' would determine whether the operator's verbal response matched any of the menu choices. In practice, in processing the steps of FIG. 9 the CPU 504 may interact with the voice-recognition module 522' by invoking software routines stored in the voice-recognition module 522' pursuant to programming in the application program 522'.

In step 916, the CPU 504 processes the recognized word or phrase (that is, the string that was returned in step 908) in accordance with the particular programming of the application program 508. For example, the recognized word or phrase may represent a command from the operator to access particular information from the database 520. In this case, the CPU 504 would access and retrieve the requested data from the database 520 located in the magnetic storage device 519. The CPU 504 would then send the retrieved data to the display screen 110 for display to the operator.

In step 918, the CPU 504 determines whether the recognized word or phrase represented an exit command. If the recognized word or phrase did not represent an exit command, then the CPU 504 loops back to step 904 to await further operator instructions. Otherwise, the CPU 504 terminates the application program in step 920.

The manner in which the voice-recognition module 522' performs step 908 (shown in FIG. 9) is illustrated in FIG. 10, which is an operational flow chart of the voice-recognition module 522' wherein the voice-recognition module 522' operates according to independent voice-recognition algorithms. Note that before the steps in FIG. 10 are performed, the voice-recognition module 522' is trained for multiple operators using well-known methods as described above with reference to FIG. 9.

In step 1004, the voice-recognition module 522' identifies the boundaries of a word or phrase contained in the digitized electrical signals (which represent the digitized verbal utterance) by locating points in the digitized electrical signals which fall below the energy threshold (as shown in FIG. 12, for example), the located points representing the boundaries of words. The voice-recognition module 522' determines that the digitized electrical signals contain a phrase (that is, multiple words), rather than a single word, if words in the digitized electrical signals are separated by less than a predefined number (which is set according to the speaking characteristics of the particular operator) of points which fall below the energy threshold. The points in the digitized electrical signals corresponding to a word or phrase represent a digitized verbal utterance waveform which was received from the operator (that is, which was spoken by the operator). For example, if FIG. 12 represents the digitized electrical signals and if the predefined number is five, then the voice-recognition module 522' determines (in step 1004) that the digitized electrical signals contain a phrase having two words because the two words are separated by only four points (between times thirteen and fifteen) which fall below the energy threshold. The points in the digitized electrical signals corresponding to the two-word phrase represent the received digitized verbal utterance waveform.

In step 1006, the voice-recognition module 522' selects the next word or phrase from the subset of words and phrases which the CPU 504 passed to the voice-recognition module 522'.

In step 1008, the voice-recognition module 522' performs a point-by-point comparison of the received digitized verbal utterance waveform and the digitized base line waveform associated with the selected word or phrase and determines whether there is a match between the received digitized verbal utterance waveform and the digitized base line waveform, in light of the permitted variances associated with the digitized base line waveform. The voice-recognition module 522' determines that a match occurs between a point in the received digitized verbal utterance waveform and a corresponding-in-time point contained in the digitized base line waveform if the difference between the two points is less than the permitted variance for that particular point. In processing step 1008, the voice-recognition module 522' generates a recognition score for the selected word or phrase which essentially represents a cumulative sum of the differences between the received digitized verbal utterance waveform and the digitized base line waveform at each point. Therefore, a lower recognition score indicates a closer match between the received digitized verbal utterance waveform and the digitized base line waveform.

In step 1010, the voice-recognition module 522' determines whether the recognition score for the selected word or phrase is less than a maximum permitted score which is software adjustable by the operator. If the recognition score for the selected word or phrase is greater than the maximum permitted score, then the voice-recognition module 522' determines that the selected word or phrase and the received digitized verbal utterance waveform did not match and processes step 1014. If the recognition score for the selected word or phrase is less than the maximum permitted score, then the voice-recognition module 522' determines that the selected word or phrase and the received digitized verbal utterance waveform matched (to a certain confidence level as described below) and processes step 1012.

In step 1012, the voice-recognition module 522' adds the selected word or phrase to an acceptable words list. Words and phrases in the acceptable words list are ordered in ascending order by their respective recognition scores, such that the first entry in the acceptable words list has the lowest recognition score.

In step 1014, the voice-recognition module 522' determines whether all the words and phrases which the CPU 504 passed to the voice-recognition module 522' have been processed. If there are more words and/or phrases to process, then the CPU 504 loops back to step 1006. Otherwise, the CPU 504 processes step 1016.

In the remaining steps in FIG. 10, the voice-recognition module 5221 interacts with the operator to determine which of the words or phrases in the acceptable words list is the word or phrase which was spoken by the operator. Specifically, in step 1016 the voice-recognition module 522' selects the first entry in the acceptable words list. Recall that the first entry has the lowest voice-recognition score of all the entries in the acceptable words list.

In step 1018 the voice-recognition module 522' generates a confidence value for the first entry by subtracting the recognition score of the second entry from the recognition score of the first entry. The confidence value of the first entry quantifies how confident the voice-recognition module 522' is that the first entry is the word or phrase which was spoken by the operator. In step 1020 the voice-recognition module 522' determines whether the confidence value of the first entry is high or low by comparing the confidence value to an operator-selected minimum confidence value. If the confidence value is greater than the minimum confidence value, then the confidence value is high and the voice-recognition module 522' processes step 1030. In step 1030, since the confidence of the first entry is high, the voice-recognition module 522' returns to the CPU 504 the string associated with the first entry to the CPU 504 for processing (in step 916 of FIG. 9).

If, in step 1020, the confidence value is less than the minimum confidence value, then the confidence value is low and the voice-recognition module 522' processes step 1022. In step 1022, the voice-recognition module 522' asks the operator whether the first entry is the correct word or phrase (that is, the word or phrase spoken by the operator). The voice-recognition module 522' may query the operator by displaying a message to the operator on the display screen 110 or by sending the message in audio form to the operator via the speaker 332 (or, alternatively, to the microphone/speaker 122 if the microphone/speaker 122 is an ear microphone or to an independent speaker if the microphone 122 is a headset microphone and does not have a transducer for outputting audio signals). The operator may respond to the query from the voice-recognition module 522' in a number of ways, such as speaking into the microphone 122 or by manipulating the pointing device 330. If the operator responds that the first entry is correct, then the voice-recognition module 522' processes step 1028 (described below). Otherwise, the voice-recognition module 522' processes step 1024.

In step 1024, since the operator has indicated that the first entry is not correct, the voice-recognition module 522' determines whether there are any more entries in the acceptable words list to process. If there are more entries to process, then the voice-recognition module 522' processes step 1026, wherein the voice-recognition module 522' selects the next entry in the acceptable words list and then loops back to step 1022 to query the operator whether the newly selected entry is correct. Otherwise, if there are no former entries to process (see step 1024), the voice-recognition module 522' processes step 1028.

As described above, step 1028 is reached when either (1) in step 1022, the operator indicates that the selected entry is correct, or (2) in step 1024, the operator effectively indicates that none of the entries in the acceptable words list is correct. In step 1028, the voice-recognition module 522' interacts with the operator to update the training of the vocabulary model according to well-known methods such that the voice-recognition module 522' will be able to more confidently recognize the operator's verbal utterance in the future. Since the voice-recognition module 522, utilizes well-known methods in step 1028, step 1028 will not be discussed further.

After updating the training of the vocabulary model, the voice-recognition module 522' processes step 1030, wherein the voice-recognition module 522' returns to the CPU 504 for processing (in step 916 of FIG. 9) the string associated with the word or phrase which matches the verbal utterance as indicated by the operator (in steps 1022 and 1028).

While preferred embodiments of the invention have been described and certain modifications thereto suggested, it will be recognized by those skilled in the art that other changes may be made to the above-described embodiments in the invention without departing from the broad, inventive concepts thereof. It should be understood, therefore, that the invention is not limited to the particular embodiments disclosed but covers any modifications which are within the scope and spirit of the invention as defined by the appended claims. For instance, the computer system 102 of the present invention may be used in many applications, including (but not limited to) for use with the handicapped, for education purposes, for testing and service purposes and for inventory purposes.

What is claimed is:

1. A compact, self-contained portable computing apparatus for being completely supported by a user for hand-free retrieval and display of information for the user comprising:

a housing having securing means for removably mounting the housing on a user for being carried without hands by the user;

storage means mounted in the housing for storing previously entered information including an electronic technical manual and a preprogrammed vocabularly model of a plurality of words and phrases;

processor means mounted in the housing and communicating with the storage means for receiving, retrieving and processing information and user commands in accordance with a stored program;

audio transducer and converter means in communication with the processor means for receiving audio commands from the user, for converting the received audio commands into electrical signals, and for sending the converted electrical signals to the processor means, the audio transducer and converter means being supported hands-free by the user;

said processor means including means for recognizing a command in the converted electrical signals and responding to the recognized command by retrieving and outputting corresponding information from the electronic technical manual stored in the storage means;

said recognizing means including means for defining a subset of the plurality of words and phrases in the preprogrammed vocabulary model according to a current context of the stored program and for matching the converted electrical signals against the defined subset to recognize the command;

computer display means in communication with the processor means for receiving the outputted information from the processor means and for displaying the received information for the user; and means for mounting the computer display means on the user such that the computer display means is carried hands-free in a portion of the view of the user whereby the computing apparatus is capable of being operated to display the received information in a hands-free manner utilizing only the audio commands.

2. The computing apparatus of claim 1, wherein the display means comprises:
visual display means; and
driver means in communication with the visual display means for converting the information received from the processor means into video signals compatible with the visual display means and for displaying the compatible video signals on the visual display means.

3. The computing apparatus of claim 2, wherein the visual display means comprises a cathode ray tube (CRT) optically coupled to a filter having a first color polarizer for polarizing and separating light from the CRT into cyan and red components, a first liquid-crystal switch for rotating polarized light from the first color polarizer by zero or ninety degrees, a second color polarizer for polarizing and separating light from the first liquid-crystal switch into yellow and blue components, and a second liquid-crystal switch for rotating polarized light from the second color polarizer by zero or ninety degrees.

4. The computing apparatus of claim 3, wherein the driver means comprises means for displaying an image on the CRT in accordance with the compatible video signals and for controlling the filter in accordance with color information in the compatible video signals to convert the CRT image to a color image.

5. The computing apparatus of claim 2, wherein the visual display means comprises a video graphics array (VGA) eye piece monitor having a diagonal length of not greater than one inch.

6. The computing apparatus of claim 2, wherein the visual display means comprises an eye piece monitor having a diagonal length of not greater than one inch, wherein the eye piece monitor is a color graphics adaptor (CGA) eye piece monitor, an enhanced graphics adaptor (EGA) eye piece monitor, a video graphics array (VGA) eye piece monitor, or a super VGA eye piece monitor.

7. The computing apparatus of claim 1, further comprising measurement means in communication with the processor means for performing electrical measurements on devices being evaluated, for receiving electrical measurement signals from the devices being evaluated as a result of performing the electrical measurements, and for sending the received electrical measurement signals to the processor means, the measurement means being supported by the user.

8. The computing apparatus of claim 1, further comprising power means for supplying power to the computing apparatus, the power means being supported by the user.

9. A method for hands-free retrieval and display of information by a compact, self-contained portable computing apparatus for a user comprising the steps of:
mounting a housing containing storage means and processor means on the user for being carried hands-free by the user;
mounting a computer display device on the user for being carried hands-free by the user in a portion of the view of the user;
mounting audio transducer means on the user for being carried hands-free and for receiving verbal utterances from the user;
receiving a verbal utterance from the user in said audio transducer;
converting the received verbal utterance into electrical signals in said audio transducer;
transferring the converted electrical signals from the audio transducer to the processing means;
recognizing the converted electrical signals by said processing means to identify a user command matching the received verbal utterance;
said recognizing including defining a subset of a plurality of words and phrases in a preprogrammed vocabularly according to a current operational context and matching the converted electrical signals against the defined subset to recognize the command;
processing the user command by said processing means in accordance with a stored program, the processing step including the steps of: determining whether the user command represents an information retrieval request; if the user command represents an information retrieval request, then retrieving the requested information from an electronic technical manual previously entered into the storage mans; and displaying the retrieved information on the computer display device for the user whereby the computing apparatus is operated to display the retrieved information in a hands-free manner utilizing only audio commands.

10. The method of claim 9, wherein the recognizing step comprises the steps of:

selecting a word or phrase from a pretrained vocabulary model;

determining whether the converted electrical signals match one of a finite number of electrical waveforms associated with the selected word or phrase; and if the converted electrical signals match one of the finite number of electrical waveforms associated with the selected word or phrase, then translating the converted electrical signals to one or more particular keystrokes associated with the selected word or phrase.

11. The method of claim 9, wherein the recognizing step comprises the steps of:

determining whether deviations between the converted electrical signals and a base line waveform are within permitted variances, the base line waveform and within variances being associated with the selected word or phrase;

if deviations between the converted electrical signals and the base line wave form are within the permitted variances, then calculating a confidence value for the selected word or phrase;

if the confidence value is greater than a predetermined confidence value, then translating the converted electrical signals to a string associated with the selected word or phrase; and if the confidence value is less than the predetermined confidence value, then interacting with the user to modify the pretrained vocabulary model for the converted electrical signals.

12. The method of claim 9, wherein the displaying step comprises the steps of:

converting the retrieved information into video signals compatible with a video graphics array (VGA) monitor; and displaying the compatible video signals on the VGA monitor.

13. The method of claim 9, wherein the displaying step comprises the steps of:

converting the retrieved information into video signals compatible with a color graphics adapter (CGA) monitor; and displaying the compatible video signals on the CGA monitor.

* * * * *

REEXAMINATION CERTIFICATE (2949th)
United States Patent [19]
Newman et al.

[11] B1 5,305,244
[45] Certificate Issued Jul. 2, 1996

[54] HANDS-FREE, USER-SUPPORTED PORTABLE COMPUTER

[75] Inventors: Edward G. Newman, Fairfax; Gil S. Christian, Stephens City; Michael D. Jenkins, Manassas, all of Va.

[73] Assignee: Computer Products & Services, Inc., Fairfax, Va.

Reexamination Request:
No. 90/003,751, Mar. 15, 1995

Reexamination Certificate for:
Patent No.: 5,305,244
Issued: Apr. 19, 1994
Appl. No.: 863,619
Filed: Apr. 6, 1992

[51] Int. Cl.$^6$ ................. G06F 1/16; G06F 3/00
[52] U.S. Cl. ................. 364/708.1; 364/709.11
[58] Field of Search ............ 364/708.1, 709.01, 364/709.02, 709.11, 483; 345/8

[56] References Cited

U.S. PATENT DOCUMENTS

| | | | |
|---|---|---|---|
| 4,387,296 | 6/1983 | Newell et al. | 235/376 |
| 4,902,083 | 2/1990 | Wells | 350/6.6 |
| 4,934,773 | 6/1990 | Becker | 350/6.6 |
| 4,949,274 | 8/1990 | Hollander et al. | 364/483 |
| 5,003,300 | 3/1991 | Wells | 345/8 |
| 5,155,615 | 10/1992 | Tagawa | 359/213 |

OTHER PUBLICATIONS

O'Connor, R. J. "CD–ROM is Coming into Focus," *San Jose Mercury News*, Section F, Mar. 24, 1991, 3 pages.
Brochure on "Introvoice VI, Voice Recognition and Synthesis System" by Voice Connexion, 1989.
Brochure on "Micro Introvoice, Modular Voice Recognition and Synthesis System" by Voice Connexion, 1990.
Brochure on "VoiceScribe 1000 PLUS Speech Recognition System" by Technology Systems Int'l, Inc., dated prior to Mar. 27, 1991.
Department of Defense, Program Solicitation 90.1, "FY–1990, Small Business Innovation Research (SBIR) Program," issue date Oct. 1, 1989.
"Integrated Audio–Video Headset Display Terminal (IAVHDT) for Maintenance Personnel", Final Report to U.S. Army Electronics Command by Imaging and Sensing Technology Corporation, Mar. 27, 1991.
Article on "Private Eye" from Language Technology, Mar./Apr. 1989.
Lee, "Reflection Ships Private Eye Head–Mounted Virtual Display," Infoworld, Apr. 23, 1990.
Brochure on Hughes Portable Information Equipment, Apr. 1990.
Murphey, "City Firm Introduces 'PC–In–A–Hat'", Spokane Spokesman Review, Jun. 11, 1991.
Articled entitled "Portable Unit Gives Visual and Audible Access to CD–Rom Data", Integrated Messaging News, Apr. 1991, p. 7.

*Primary Examiner*—Roy Envall, Jr.

[57] ABSTRACT

A compact, self-contained portable computing apparatus is provided which is completely supported by a user for hands-free retrieval and display of information for the user. The computing apparatus includes a voice-recognition module, in communication with a processor, for receiving audio commands from the user, for converting the received audio commands into electrical signals, for recognizing the converted electrical signals and for sending the recognized electrical signals to the processor for processing, the voice-recognition module being supported by the user. The computing apparatus further includes a display in communication with the processor for receiving information from the processor and for displaying the received information for the user, the display being supported by the user whereby the user may operate the computing apparatus to display information in a hands-free manner utilizing only audio commands.

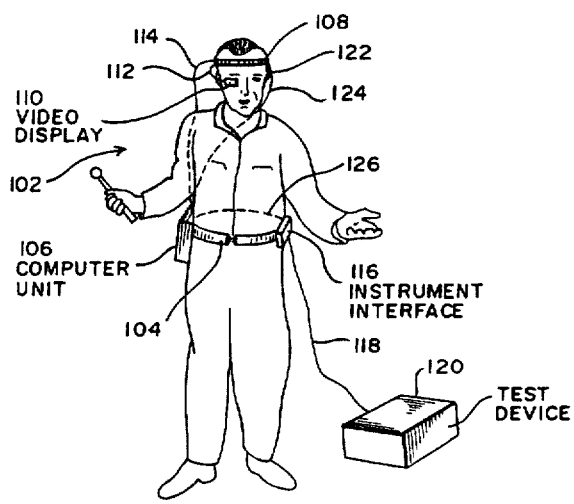

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1 and 9 are determined to be patentable as amended.

Claims 2–8 and 10–13, dependent on an amended claim, are determined to be patentable.

1. A compact, self-contained portable computing apparatus for being completely supported by a user for hand-free retrieval and display of information for the user comprising:

a general-purpose computer contained in a housing, *the general-purpose computer having storage means and processor means, the housing* having securing means for removably mounting the housing on a user for being carried without hands by the user[;],

*the* storage means [mounted in the housing for] storing previously entered information including an electronic technical manual and a preprogrammed [vocabularly] *vocabulary* model of a plurality of words and phrases[;],

*the* processor means [mounted in the housing and] communicating with the storage means for receiving, retrieving and processing information and user commands in accordance with a stored program[;], audio tranducer and converter means in communication with the processor means for receiving audio commands from the user, for converting the received audio commands into electrical signals, and for sending the converted electrical signals to the processor means, the audio transducer and converter means being supported hands-free by the user[;], said processor means including means for recognizing [a] *an audio* command in the *form of* converted electrical signals and responding to the recognized *audio* command by retrieving and outputting corresponding information from the electronic technical manual stored in the storage means[;], said recognizing means including means for defining a subset of the plurality of words and phrases in the preprogrammed vocabulary model according to a current context of the stored program and for matching the converted electrical signals against the defined subset to recognize the command;

*audio transducer and converter means in communication with the processor means for receiving the audio commands from the user, for converting the received audio commands into the electrical signals, and for sending the converted electrical signals to the processor means, the audio transducer and converter means being supported hands-free by the user;* computer display means in communication with the processor means for receiving the outputted information from the processor means and for displaying the received information for the user; and means for mounting the computer display means on the user such that the computer display means is carried hands-free in a portion of the view of the user whereby the computing apparatus is capable of being operated to display the received information in a hands-free manner utilizing only the audio commands.

9. A method for hands-free retrieval and display of information by a compact, self-contained portable computing apparatus for a user comprising the steps of:

mounting a [containing storage means and processor means] *general-purpose computer contained in a housing* on the user for being carried hands-free by the user, *the general-purpose computer having storage means and processor means*;

mounting a computer display device on the user for being carried hands-free by the user in a portion of the view of the user;

mounting audio transducer means on the user for being carried hands-free and for receiving verbal utterances from the user;

receiving a verbal utterance from the user in said audio transducer;

converting the received utterance into electrical signals in said audio transducer;

transferring the converted electrical signals from the audio transducer to the processing means;

recognizing the converted electrical signals by said processing means to identify a user command matching the received verbal utterance;

said recognizing including defining a subset of a plurality of words and phrases in a preprogrammed [vocabularly] *vocabulary* according to a current operational context and matching the converted electrical signals against the defined subset to recognize the command;

processing the user command by said processing means in accordance with a stored program, the processing step including the steps of: determining whether the user command represents an information retrieval request; if the user command represents an information retrieval request, then retrieving the requested information from an electronic technical manual previously entered into the storage [mans] *means*; and displaying the retrieved information on the computer display device for the user whereby the computing apparatus is operated to display the retrieved information in a hands-free manner utilizing only audio commands.

* * * * *